(12) United States Patent
Takewaki et al.

(10) Patent No.: US 9,362,401 B2
(45) Date of Patent: Jun. 7, 2016

(54) SEMICONDUCTOR DEVICE

(71) Applicant: Renesas Electronics Corporation, Kawasaki-shi (JP)

(72) Inventors: Toshiyuki Takewaki, Kawasaki (JP); Hironobu Miyamoto, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 14/733,557

(22) Filed: Jun. 8, 2015

(65) Prior Publication Data

US 2015/0270394 A1     Sep. 24, 2015

Related U.S. Application Data

(63) Continuation of application No. 14/448,979, filed on Jul. 31, 2014, now Pat. No. 9,070,661.

(30) Foreign Application Priority Data

Aug. 28, 2013  (JP) ................. 2013-176460

(51) Int. Cl.
| | | |
|---|---|---|
| *H01L 29/80* | (2006.01) | |
| *H01L 29/78* | (2006.01) | |
| *H01L 27/088* | (2006.01) | |
| *H01L 29/40* | (2006.01) | |
| *H01L 29/423* | (2006.01) | |

(Continued)

(52) U.S. Cl.
CPC ........ *H01L 29/7843* (2013.01); *H01L 27/0207* (2013.01); *H01L 27/0605* (2013.01); *H01L 27/088* (2013.01); *H01L 29/2003* (2013.01); *H01L 29/402* (2013.01); *H01L 29/408* (2013.01); *H01L 29/4236* (2013.01); *H01L 29/475* (2013.01); *H01L 29/66462* (2013.01); *H01L 29/7786* (2013.01);

(Continued)

(58) Field of Classification Search
CPC ... H01L 21/221; H01L 21/265; H01L 29/408; H01L 29/7843; H01L 29/80; H01L 29/66477; H01L 27/088
USPC .................................................. 257/192, 330
See application file for complete search history.

(56) References Cited

U.S. PATENT DOCUMENTS

| | | |
|---|---|---|
| 5,798,555 A | 8/1998 | Mishra et al. |
| 6,121,086 A | 9/2000 | Kuroda et al. |

(Continued)

FOREIGN PATENT DOCUMENTS

| | | |
|---|---|---|
| JP | 2008-177527 A | 7/2008 |
| JP | 2010-27734 A | 2/2010 |
| JP | 2010-135824 A | 6/2010 |

*Primary Examiner* — Nathan Ha
(74) *Attorney, Agent, or Firm* — McGinn IP Law Group, PLLC

(57) ABSTRACT

A semiconductor device includes a substrate, a buffer layer provided on the substrate, a channel layer provided on the buffer layer, an electron supply layer provided on the channel layer, a first contact hole provided on the electron supply layer, a source electrode that is formed within the first contact hole, and electrically connected to the electron supply layer, a second contact hole provided on the electron supply layer, a drain electrode that is formed within the second contact hole, and electrically connected to the electron supply layer, a gate electrode provided between the source electrode and the drain electrode, a second insulating film that is formed to cover the gate electrode, a strain relaxation film that is formed over the second insulating film above the gate electrode, a third insulating film that is formed to cover the source electrode, the drain electrode, and the strain relaxation film, and an organic film that is formed over the third insulating film.

23 Claims, 16 Drawing Sheets

(51) Int. Cl.
  *H01L 29/778* (2006.01)
  *H01L 29/20* (2006.01)
  *H01L 27/02* (2006.01)
  *H01L 27/06* (2006.01)
  *H01L 29/47* (2006.01)
  *H01L 29/66* (2006.01)
  *H01L 29/417* (2006.01)
  *H01L 29/49* (2006.01)

(52) U.S. Cl.
  CPC ...... *H01L 29/7787* (2013.01); *H01L 29/41758* (2013.01); *H01L 29/4966* (2013.01); *H01L 29/66477* (2013.01); *H01L 29/80* (2013.01)

(56) References Cited

U.S. PATENT DOCUMENTS

| | | | |
|---|---|---|---|
| 6,222,231 B1* | 4/2001 | Satou | H01L 29/408 257/329 |
| 6,452,230 B1* | 9/2002 | Boden, Jr. | H01L 29/405 257/329 |
| 7,291,872 B2 | 11/2007 | Hikita et al. | |
| 7,550,821 B2 | 6/2009 | Shibata et al. | |
| 7,859,014 B2 | 12/2010 | Nakayama et al. | |
| 8,304,811 B2 | 11/2012 | Zhang | |
| 8,519,438 B2 | 8/2013 | Mishra et al. | |
| 8,946,769 B2* | 2/2015 | Darwish | H01L 29/408 257/122 |
| 2002/0070418 A1* | 6/2002 | Kinzer | H01L 29/0634 257/496 |
| 2002/0074585 A1* | 6/2002 | Tsang | H01L 21/221 257/302 |
| 2009/0152627 A1 | 6/2009 | Kikuchi et al. | |
| 2010/0314663 A1 | 12/2010 | Ito et al. | |
| 2013/0214283 A1 | 8/2013 | Briere et al. | |
| 2013/0313609 A1 | 11/2013 | Akutsu et al. | |
| 2013/0341679 A1 | 12/2013 | Green et al. | |

* cited by examiner

SEMICONDUCTOR DEVICE

REFERENCE TO RELATED APPLICATION

This application is a Continuation Application of U.S. patent application Ser. No. 14/448,979, which was filed on Jul. 31, 2014, and the disclosure of which is incorporated herein in its entirety by reference thereto.

CROSS-REFERENCE TO RELATED APPLICATIONS

The disclosure of Japanese Patent Application No. 2013-176460 filed on Aug. 28, 2013 including the specification, drawings and abstract is incorporated herein by reference in its entirety.

BACKGROUND

The present invention relates to a semiconductor device, which can be preferably used, for example, for a MISFET (metal insulator semiconductor field effect transistor) made of a nitride semiconductor material.

In recent years, a power MISFET made of the nitride semiconductor material has been proposed.

For example, Japanese Unexamined Patent Application Publication No. 2010-135824 discloses a semiconductor device made of a nitride semiconductor which includes a first source electrode connected to a conductive substrate, and a second source electrode extended toward a drain electrode so as to cover an upside of a gate electrode.

Also, Japanese Unexamined Patent Application Publication No. 2010-027734 discloses a nitride semiconductor device in which a source pad and a gate pad are formed over one surface of a component chip, a drain electrode is formed over the other surface of the component chip, and an aluminum wire is joined to the drain electrode.

Also, Japanese Unexamined Patent Application Publication No. 2008-177527 discloses a nitride semiconductor device in which a first electrode is formed in an active region of a nitride semiconductor layer, and a first electrode pad electrically connected to the first electrode is formed in an upper region of an interlayer insulating film that covers the gate electrode.

SUMMARY

As a material of the power MISFET, a changeover from silicon (Si) to gallium nitride (GaN) has been studied. However, because gallium nitride (GaN) is a material high in piezoelectric characteristics, a polarization charge is liable to be generated in gallium nitride (GaN). For that reason, the power MISFET made of gallium nitride (GaN) is problematic in device characteristics, for example, a fluctuation of a threshold voltage and an on-resistance.

The other problems and novel features will become apparent from the description of the present specification and the attached drawings.

In one embodiment, a strain relaxation film is arranged between a resin film that protects the power MISFET and the power MISFET. The strain relaxation film suppresses a stress applied to the power MISFET from the resin film.

According to one embodiment, the reliability of the power MISFET made of the nitride semiconductor material can be improved.

DETAILED DESCRIPTION

Figure 1:
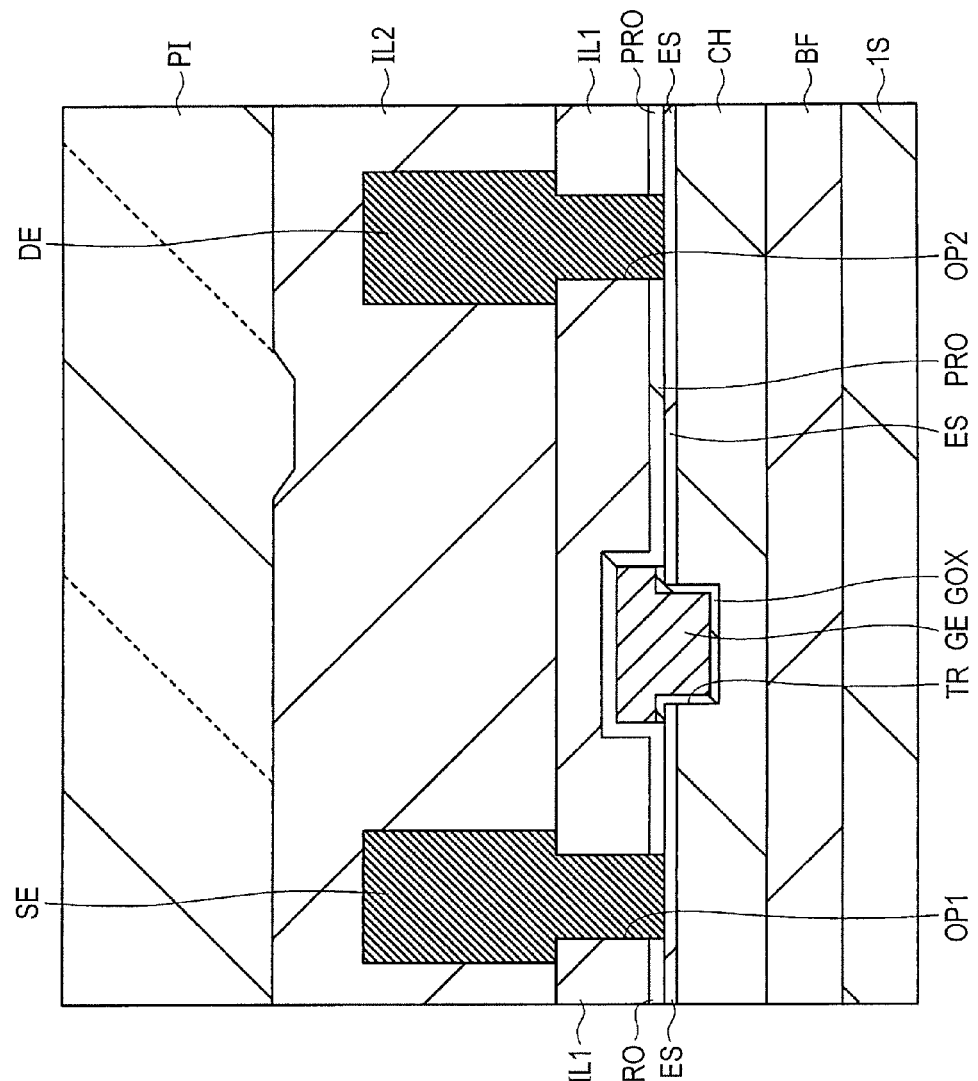
FIG. 1 is a cross-sectional view illustrating a configuration example of a power MISFET in a related art.

In the embodiments described below, the invention will be described in a plurality of sections or embodiments when required as a matter of convenience. However, these sections or embodiments are not irrelevant to each other unless otherwise stated, and the one relates to the entire or a part of the other as a modification, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Also, it is needless to say that the term "comprises A", "made of A", "has A", or "contains A" does not exclude elements other than A unless otherwise specifically indicating that the element includes only A.

Likewise, in the embodiments described below, when a reference is made to the shape, positional relationship, or the like of the components, that substantially approximate or similar to it is also embraced unless otherwise specifically indicated or principally apparent that it is not. This also applies to the above-described value and range.

Further, in the drawings used in the embodiments, hatching may be used in some cases even in a plan view so as to make the drawings easy to see. Also, components having the same function are denoted by the same reference numbers throughout the drawings for describing the embodiments, and the repetitive description thereof will be omitted.

First Embodiment

Description of Related Art

First, before a power MISFET according to a first embodiment is described, a power MISFET in the related-art will be described. FIG. 1 is a cross-sectional view illustrating a configuration example of the power MISFET in the related art.

As illustrated in FIG. 1, in the power MISFET of the related-art, a nitride semiconductor layer is formed over a semiconductor substrate 1S made of, for example, silicon (Si). A buffer layer BF made of, for example, gallium nitride (GaN) is formed over the nitride semiconductor layer, and a channel layer CH made of, for example, gallium nitride (GaN) is formed over the buffer layer BF. An electron supply layer ES made of, for example, aluminum gallium nitride (AlGaN) is formed over the channel layer CH. The buffer layer BF is formed for the purpose of reducing mismatch between crystal lattice intervals of silicon (Si) configuring the semiconductor substrate 1S, and crystal lattice intervals of gallium nitride (GaN) configuring the channel layer CH.

A trench (also called "groove") TR is formed which reaches the channel layer CH from a surface of the electron supply layer ES beyond an interface between the electron supply layer ES and the channel layer CH. A gate insulating film GOX made of, for example, silicon oxide ($SiO_2$) is formed over an inner wall of the trench TR, and a gate electrode GE is embedded within the trench TR through the gate insulating film GOX. The gate electrode GE is made of, for example, titanium nitride (TiN).

Further, a protective film PRO made of, for example, a silicon nitride (SiN), and a first interlayer insulating film IL1 made of, for example, silicon oxide ($SiO_2$) so as to cover the gate electrode GE. A source contact hole OP1 and a drain contact hole OP2 are formed within the protective film PRO and the first interlayer insulating film IL1 so as to expose a surface of the electron supply layer ES in the active region.

A source electrode SE is embedded within the source contact hole OP1. Likewise, a drain electrode DE is embedded within the drain contact hole OP2. The source electrode SE and the drain electrode DE are each formed of, for example, a laminated film in which a titanium (Ti) film, a titanium nitride (TiN) film, an aluminum (Al) alloy film, and a titanium nitride (TiN) film are laminated on each other in the stated order from a lower layer.

Further, a second interlayer insulating film IL2 is so formed as to cover the first interlayer insulating film IL1. The second interlayer insulating film IL2 is made of, for example, a silicon oxide ($SiO_2$). A resin film for protecting the power MISFET, for example, a polyimide film PI which is 5 μm to 7 μm in thickness is formed over the second interlayer insulating film IL2.

According to the present inventors' study, the power MISFET in the related-art configured as described above remains a matter of improvement in the following point. The following point is not disclosed in the related art of the above-mentioned Japanese Unexamined Patent Application Publication No. 2010-135824, Japanese Unexamined Patent Application Publication No. 2010-027734, and Japanese Unexamined Patent Application Publication No. 2008-177527, and first found by the present inventors.

When a current flows in the power MISFET, a temperature of the overall power MISFET rises due to Joule heat, and a stress is exerted on the nitride semiconductor layer from the polyimide film PI due to a difference in a coefficient of thermal expansion between the polyimide film PI and the nitride semiconductor layer. Also, in an assembly process (package assembly process), in order to cure the polyimide film PI, a heat treatment of about 170° C. to 250° C. is conducted to exert the stress on the nitride semiconductor layer from the polyimide film PI. Because the polyimide film PI is shrunk in curing, the stress is always exerted on the nitride semiconductor layer after thermal curing.

In this example, because the nitride semiconductor (for example, GaN) is of a wurtzite structure, which is a crystal structure having no reversal symmetry, polarized charge is generated when the stress is exerted on the nitride semiconductor layer. The polarized charge changes according to the stress exerted on the nitride semiconductor.

When the stress is exerted particularly on the electron supply layer ES and the channel layer CH in the nitride semiconductor layer, the polarized charge attributable to the stress is generated in addition to spontaneously polarized charge originally formed over the respective layers of the nitride semiconductor layer. As a result, a channel electron concentration including 2D electron gas, which is generated within the channel layer CH, is changed. For that reason, the on-resistance fluctuates.

In particular, when the stress is exerted on a region of the electron supply layer ES and the channel layer CH below the gate electrode GE, the channel electron concentration in the channel layer CH is changed, as a result of which the threshold voltage fluctuates.

Under the circumstance, the first embodiment is devised to improve the power MISFET in the above-mentioned related art. Hereinafter, a technical concept of the first embodiment thus devised will be described.

Configuration of Power MISFET According to First Embodiment

Figure 2:
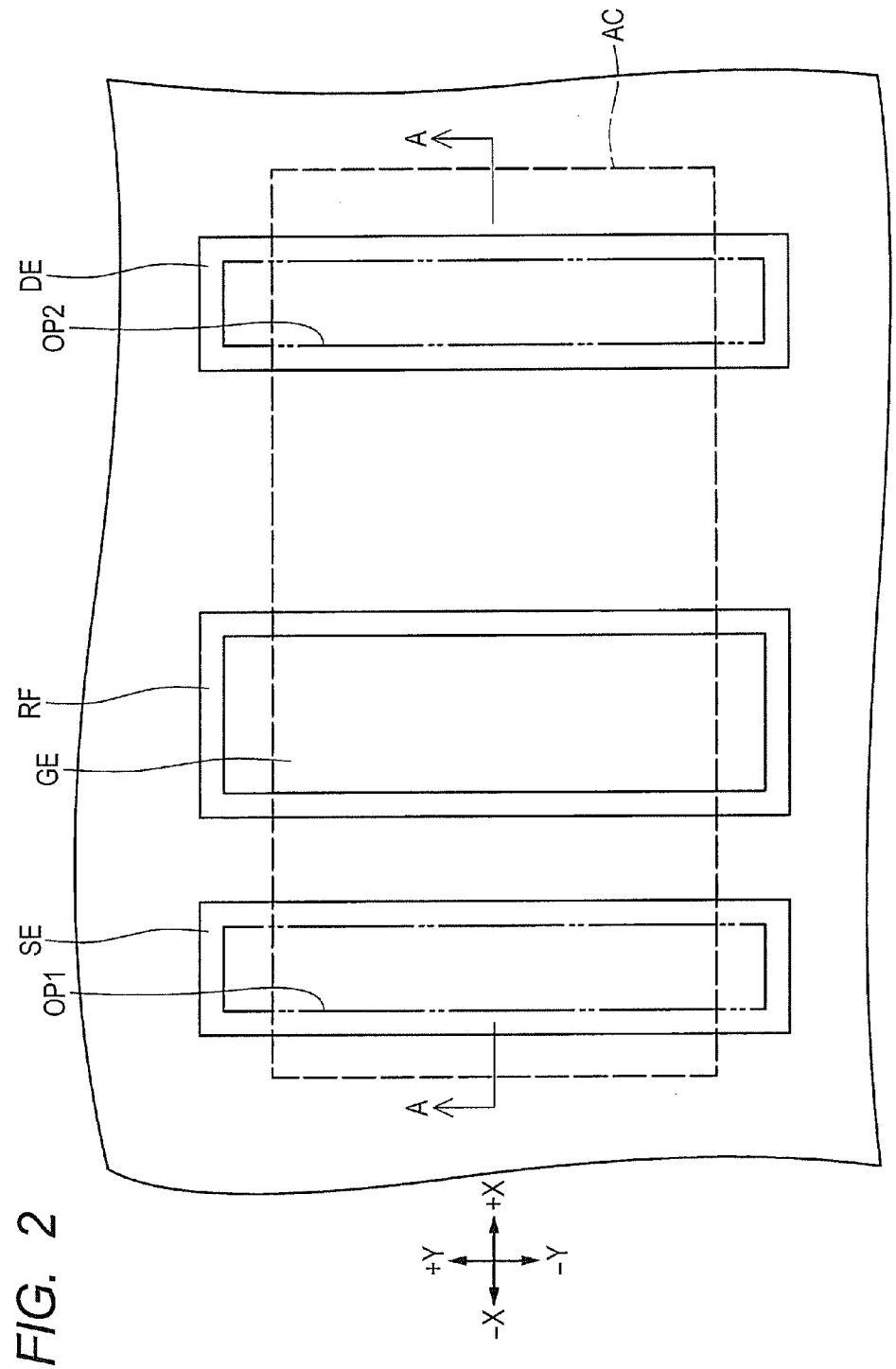
FIG. 2 is a partially enlarged plan view illustrating a configuration example of a power MISFET according to a first embodiment.
Figure 3:
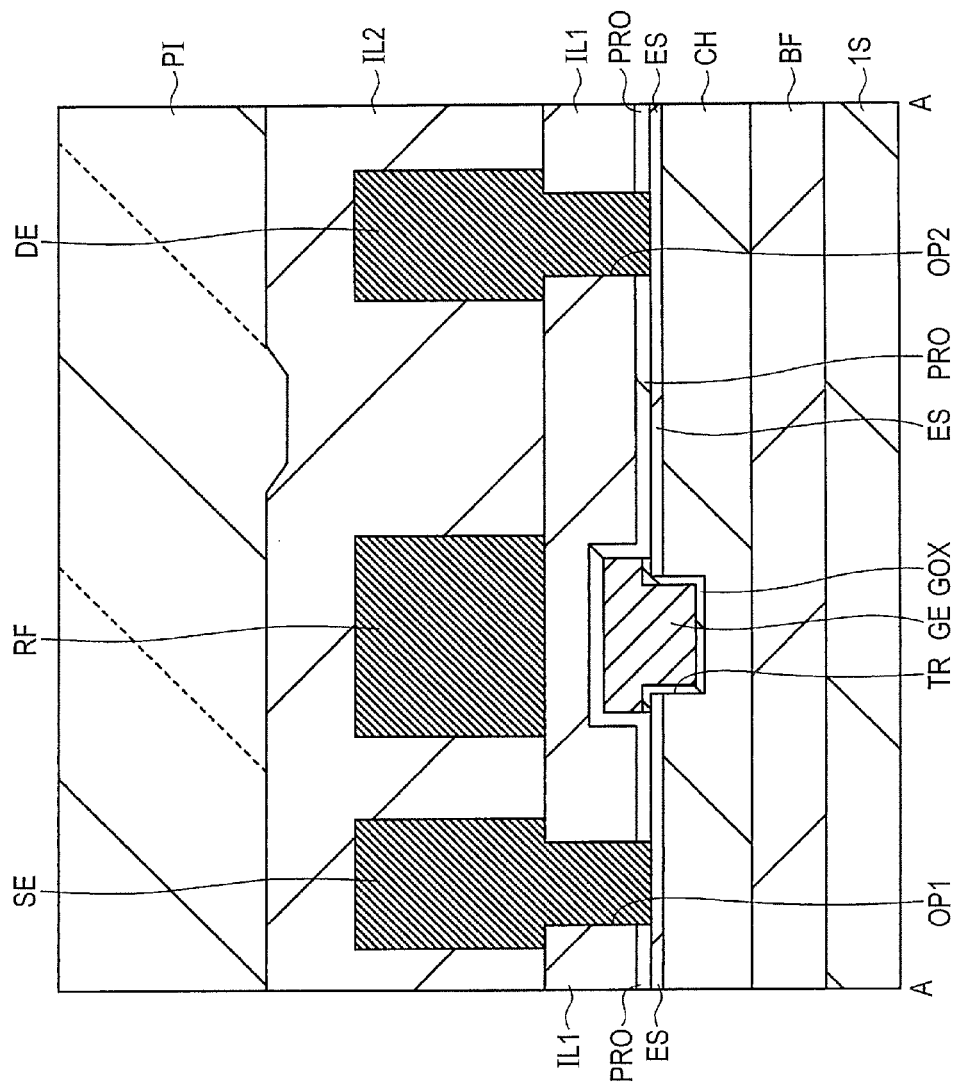
FIG. 3 is a cross-sectional view taken along a line A-A of FIG. 2.

A configuration example of a power MISFET according to the first embodiment will be described with reference to FIGS. 2 and 3. FIG. 2 is a partially enlarged plan view the power MISFET according to the first embodiment. FIG. 3 is a cross-sectional view taken along a line A-A of FIG. 2.

As illustrated in FIG. 3, in the power MISFET according to the first embodiment, a buffer layer BF in which, for example, aluminum gallium nitride (AlGaN) and gallium nitride (GaN) are laminated on each other is formed over a semiconductor substrate 1S made of, for example, silicon (Si). A channel layer CH made of, for example, a gallium nitride (GaN) is formed over the buffer layer BF. An electron supply layer ES made of, for example, aluminum gallium nitride (AlGaN) is formed over the channel layer CH. A thickness of the channel layer CH is, for example, 1 μm, and a thickness of the electron supply layer ES is, for example, 0.03 μm.

In this example, the buffer layer BF is formed for the purpose of reducing mismatch between crystal lattice intervals of silicon (Si) configuring the semiconductor substrate 1S, and crystal lattice intervals of gallium nitride (GaN) configuring the channel layer CH. That is, when the channel layer CH made of gallium nitride (GaN) is formed directly on the semiconductor substrate 1S made of silicon (Si), a large number of crystal defects is formed in the channel layer CH, resulting in performance degradation of the power MISFET.

From this viewpoint, the buffer layer BF intended for reducing the lattice mismatch is inserted between the semiconductor substrate 1S and the channel layer CH. With the formation of the buffer layer BF, the quality of the channel layer CH formed over the buffer layer BF can be improved with the result that the performance of the power MISFET can be improved.

In the first embodiment, an example in which silicon (Si) is used as the semiconductor substrate 1S is described. However, the semiconductor substrate 1S is not limited to this configuration, but may be formed of a substrate made of silicon carbide (SiC), aluminum oxide ($Al_2O_3$), gallium nitride (GaN), or diamond (C).

Subsequently, as illustrated in FIGS. 2 and 3, a trench TR that reaches the channel layer CH from a surface of the electron supply layer ES beyond an interface between the electron supply layer ES and the channel layer CH is formed in an active region AC extending in an X-axis direction. The trench TR is formed to extend in a Y-axis direction orthogonal to the X-axis direction, and protrude from the active region AC in the X-axis direction, in a plan view. In this example, in the plan view, ion implantation for element separation is conducted outside the active region AC. With the ion implantation, a deep level is formed in the nitride semiconductor layer to make carrier inactive. As an element separation method, mesa isolation for removing the electron supply layer ES to prevent the 2D electron gas from being generated may be conducted, or ion implantation and mesa isolation may be conducted together.

A gate insulating film GOX made of, for example, silicon oxide ($SiO_2$) or aluminum oxide ($Al_2O_2$) is formed over an inner wall of the trench TR, and a gate electrode GE is embedded within the trench TR. The gate electrode GE is made of, for example, titanium nitride (TiN). The gate electrode GE is formed to protrude from the active region AC in the Y-axis direction.

Further, the protective film PRO and the first interlayer insulating film IL1 are so formed as to cover the gate electrode GE. The protective film PRO is made of, for example, silicon nitride (SiN), and has a thickness of, for example, 0.09 μm. Also, the first interlayer insulating film IL1 is made of, for example, silicon oxide ($SiO_2$), and has a thickness of, for example, about 0.7 μm to 1.0 μm.

The source contact hole OP1 that is away from the gate electrode GE (a side toward a −X-axis direction) and comes in contact with a surface of the electron supply layer ES is formed within the protective film PRO and he first interlayer insulating film ILL Likewise, the drain contact hole OP2 that is away from the gate electrode GE and comes in contact with the surface of the electron supply layer ES is formed at a side opposite to the source contact hole OP1 (a side toward a +X-axis direction) with respect to the gate electrode GE. The source electrode SE is embedded within the source contact hole OP1, and the drain electrode DE is embedded within the drain contact hole OP2. The source contact hole OP1 and the drain contact hole OP2 are formed to protrude from the active region AC in the Y-axis direction in a plan view.

The source electrode SE and the drain electrode DE are each formed of a laminated film (hereinafter also referred to as "Ti/TiN/Al—Cu/TiN laminated film") in which, for example, a titanium (Ti) film, a titanium nitride (TiN) film, an aluminum-copper (Al—Cu) alloy film, and a titanium nitride (TiN) film are laminated on each other in the stated order from a lower layer. A thickness of the titanium (Ti) film in the Ti/TiN/Al—Cu/TiN laminated film is, for example, 0.03 μm. A thickness of the titanium nitride (TiN) film below the aluminum-copper (Al—Cu) alloy film is, for example, 0.1 μm. A thickness of the aluminum-copper (Al—Cu) alloy film is, for example, 4.5 μm. A thickness of the titanium nitride (TiN) film over the aluminum-copper (Al—Cu) alloy film is, for example, 0.05 μm.

The titanium (Ti) film and the titanium nitride (TiN) film which configure the Ti/TiN/Al—Cu/TiN laminated film, and formed below the aluminum-copper (Al—Cu) alloy film have a barrier function for preventing cupper (Cu) from diffusing. Also, the titanium nitride (TiN) film formed over the aluminum-copper (Al—Cu) alloy film is disposed for the purpose of improving the electromigration resistances of the source electrode SE and the drain electrode DE.

Further, as illustrated in FIGS. 2 and 3, a strain relaxation layer RF is formed above the electron supply layer ES which is the nitride semiconductor layer. The strain relaxation layer RF is formed of a Ti/TiN/Al—Cu/TiN laminated film, and formed over the first interlayer insulating film ILL In particular, when the strain relaxation layer RF is so formed as to cover an upside of the gate electrode GE, the fluctuation of a threshold voltage can be effectively suppressed.

The strain relaxation layer RF is formed in the same layer as that of the source electrode SE and the drain electrode DE. Also, the strain relaxation layer RF can be so configured as not to be electrically connected to the source electrode SE and the drain electrode DE. For example, the strain relaxation layer RF may be disconnected from other wirings, and electrically isolated therefrom. In this case, a capacitive coupling is formed between the strain relaxation layer RF and the gate electrode GE, but an advantage that a potential can be uniformly applied to the gate electrode GE is obtained. For example, when an RF signal is input by an influence of an interconnection resistance of the gate electrode GE, even if the potential is not identical between both ends of the extended gate electrode GE, the capacitive coupling enables the potential to be identical between both ends thereof.

Also, the strain relaxation layer RF and the gate electrode GE may be connected to each other by contact, and the strain relaxation layer RF may be used as a backing wiring of the gate electrode GE. Because a gate voltage is more evenly applied, the power MISFET can be evenly operated. This is particularly effective in a multi-cell configuration in which a plurality of power MISFETs is connected in parallel to each other.

The source electrode SE, the drain electrode DE, and the strain relaxation layer RF are not limited to the Ti/TiN/Al—Cu/TiN laminated film, but may be each formed of a laminated film (hereinafter also referred to as "Ti/TiN/Al—Cu/TiN laminated film") in which, for example, a titanium (Ti) film, an aluminum-copper (Al—Cu) alloy film, and a titanium nitride (TiN) film are laminated on each other in the stated order from a lower layer. In this case, the thickness of the titanium (Ti) film in the Ti/TiN/Al—Cu/TiN laminated film is, for example, 0.03 μm. The thickness of the aluminum-copper (Al—Cu) alloy film is, for example, 4.5 μm. The thickness of the titanium nitride (TiN) film is, for example, 0.05 μm.

Also, main conductor films of the source electrode SE, the drain electrode DE, and the strain relaxation layer RF are each formed of the aluminum-copper (Al—Cu) alloy film, but are not limited to this configuration. The main conductor films of those components may be each formed of, for example, an aluminum-silicon-cupper (Al—Si—Cu) alloy film.

Now, a reason why the trench TR in which the gate electrode GE is embedded through the gate insulating film GOX reaches the channel layer CH beyond an interface between the channel layer CH and the electron supply layer ES will be described below.

For example, in the case of the power MISFET in which the gate electrode GE is arranged over the electron supply layer ES, 2D electron gas attributable to band discontinuity between the electron supply layer ES and the channel layer CH is generated even in a state where no voltage is applied to the gate electrode GE. For that reason, the power MISFET becomes a normally-on type device in which the threshold voltage becomes negative.

However, in the case of the power MISFET in which the gate electrode GE is of a trench structure according to the first embodiment, the electron supply layer ES below the gate electrode GE is removed by the trench structure. For that reason, the band discontinuity per se between the electron supply layer ES and the channel layer CH is eliminated. Because the band discontinuity is absent, the 2D electron gas is not generated in the channel layer CH below the gate electrode GE. As a result, a normally-off type device in which the threshold voltage is positive can be realized.

Further, as illustrated in FIG. 3 the second interlayer insulating film IL2 is formed over the first interlayer insulating film IL1 so as to cover the source electrode SE, the drain electrode DE, and the strain relaxation layer RF. The second interlayer insulating film IL2 is formed of a laminated film in which, for example, a silicon oxide ($SiO_2$) film and a silicon oxynitride (SiON) film are laminated on each other in the stated order from a lower layer. A thickness of the silicon oxide ($SiO_2$) film is, for example, 0.12 μm, and a thickness of the silicon oxynitride (SiON) film is, for example, 0.9 μm. A resin film for protecting the power MISFET, for example, a polyimide film PI which is, for example, 5 μm to 7 μm in thickness is formed over the second interlayer insulating film IL2.

Features of Power MISFET According to First Embodiment

Now, the features of the power MISFET according to the first embodiment will be described below.

A main difference between the power MISFET according to this embodiment and the power MISFET in the above-mentioned related art resides in that the strain relaxation layer RF formed of the Ti/TiN/Al—Cu/TiN laminated film is disposed between the polyimide film PI and the gate electrode GE.

As described above, when a current flows in the power MISFET, a temperature of the overall power MISFET rises due to Joule heat, and a stress is exerted on the nitride semiconductor layer from the polyimide film PI due to a difference in the coefficient of thermal expansion between the polyimide film PI and the nitride semiconductor layer. Also, in the assembly process, even when the heat treatment of about 170° C. to 250° C. is conducted in order to cure the polyimide film PI, the stress is exerted on the nitride semiconductor layer from the polyimide film PI.

With the stress exerted on the nitride semiconductor layer, the polarized charge attributable to the stress is generated in addition to spontaneously polarized charge originally formed over the respective layers of the nitride semiconductor layer. As a result, the channel electron concentration including the 2D electron gas, which is generated within the channel layer CH, is changed. For that reason, the on-resistance fluctuates.

In particular, when the stress is exerted on a region of the electron supply layer ES and the channel layer CH below the gate electrode GE, the channel electron concentration in the channel layer CH is changed, as a result of which the threshold voltage fluctuates.

However, in the power MISFET according to the first embodiment, the strain relaxation layer RF is disposed between the polyimide film PI and the gate electrode GE, and the stress to be exerted on the electron supply layer ES and the channel layer CH below the gate electrode GE from the polyimide film PI is suppressed.

In particular, in a process of thermally curing the polyimide film PI, the polyimide film PI is shrunk (compressed) by curing whereas the nitride semiconductor layer is expanded (extended). For that reason, a very strong stress difference is generated between the polyimide film PI and the nitride semiconductor layer. Because the strain relaxation layer RF in the first embodiment is expanded like the nitride semiconductor layer, the stress strain between the nitride semiconductor layer and the strain relaxation layer RF is small in the thermal curing process. On the other hand, the stress from the polyimide film PI is exerted on the strain relaxation layer RF, thereby being capable of effectively suppressing the stress to be exerted on the nitride semiconductor layer from the polyimide film PI. As a result, in the first embodiment, the fluctuation of the threshold voltage can be suppressed.

Since the aluminum-copper (Al—Cu) alloy film configuring the Ti/TiN/Al—Cu/TiN laminated film is made of a thermally expanded material, the provision of the Ti/TiN/Al—Cu/TiN laminated film between the polyimide film PI and the gate electrode GE is effective in relaxing the stress strain generated in the electron supply layer ES and the channel layer CH.

Further, the source contact hole OP1 and the drain contact hole OP2 are formed to protrude from the active region AC in the Y-axis direction. The source electrode SE formed of the Ti/TiN/Al—Cu/TiN laminated film is embedded in the source contact hole OP1, and the drain electrode DE formed of the Ti/TiN/Al—Cu/TiN laminated film is embedded in the drain contact hole OP2. With this configuration, the stress strain of the electron supply layer ES and the channel layer CH in the Y-axis direction can be relaxed.

As described above, the strain relaxation layer RF is disposed between the polyimide film PI and the gate electrode GE. Further, the source contact hole OP1 and the drain contact hole OP2 are formed to protrude from the active region AC in the Y-axis direction with the result that the stress to be exerted on the electron supply layer ES and the channel layer CH from the polyimide film PI can be suppressed. With the above configuration, the fluctuation of the threshold voltage can be suppressed.

Method of Manufacturing Power MISFET According to First Embodiment

A method of manufacturing the power MISFET according to the first embodiment will be described with reference to FIGS. 4 to 11. FIGS. 4 to 11 are cross-sectional views of the power MISFET.

Figure 4:
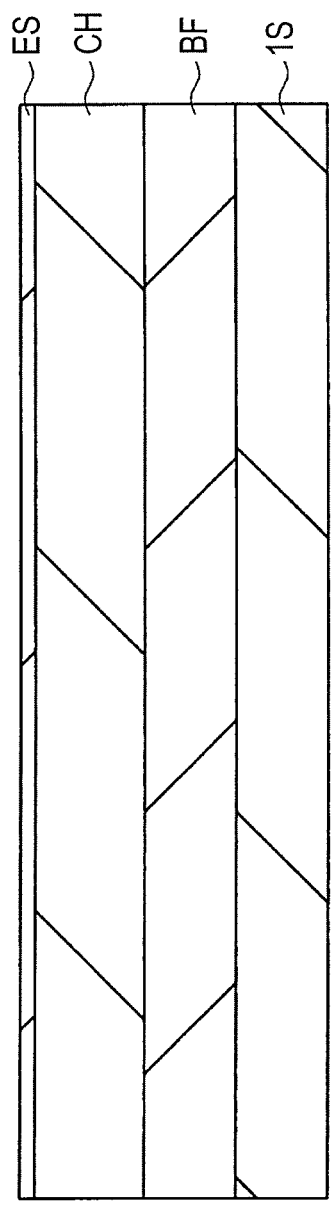
FIG. 4 is a cross-sectional view illustrating a process of manufacturing the power MISFET according to the first embodiment.

As illustrated in FIG. 4, a semiconductor layer structure is formed over a semiconductor layer made of silicon from which, for example, a (111) plane is exposed through a metal organic chemical vapor deposition (MOCVD).

In this semiconductor layer structure, the buffer layer BF made of, for example, undoped gallium nitride (GaN) is formed. Subsequently, the channel layer CH made of undoped gallium nitride (GaN) is formed over the buffer layer BF. The thickness of the channel layer CH is, for example, 1 μm. Then, the electron supply layer ES made of undoped aluminum gallium nitride (AlGaN) is formed over the channel layer CH. The thickness of the aluminum gallium nitride (AlGaN) is, for example, 0.03 μm. In this way, the semiconductor layer structure is formed. The semiconductor layer structure is formed by a III-plane growth ((0001) plane growth) in which the layers are laminated in a [0001] crystal axis (C-axis) direction.

Figure 5:
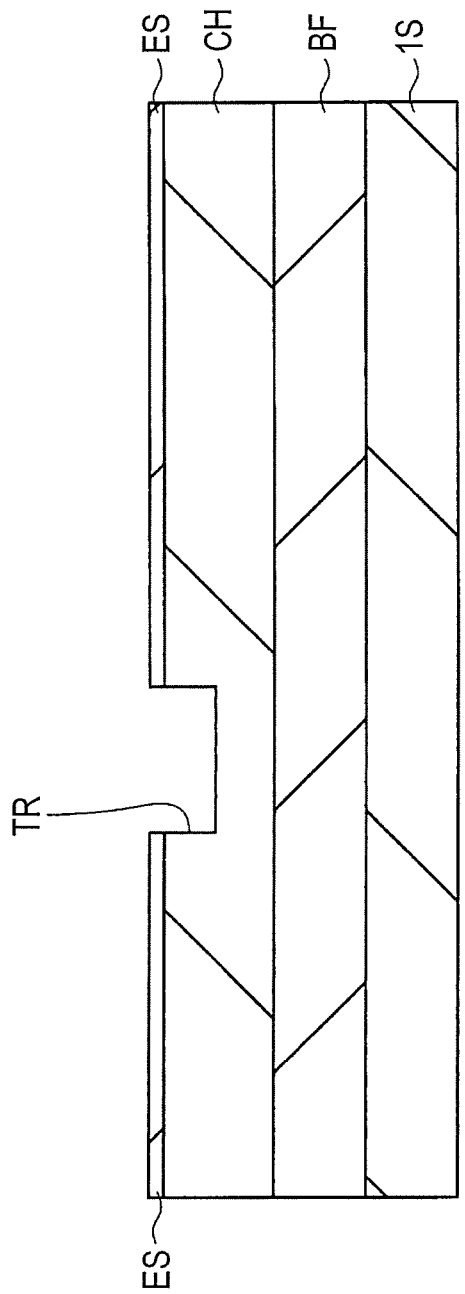
FIG. 5 is a cross-sectional view illustrating the process of manufacturing the power MISFET subsequent to FIG. 4.

Then, as illustrated in FIG. 5, the trench TR that penetrates through the electron supply layer ES and reaches the channel layer CH is formed through the photolithography and the etching technique.

Figure 6:
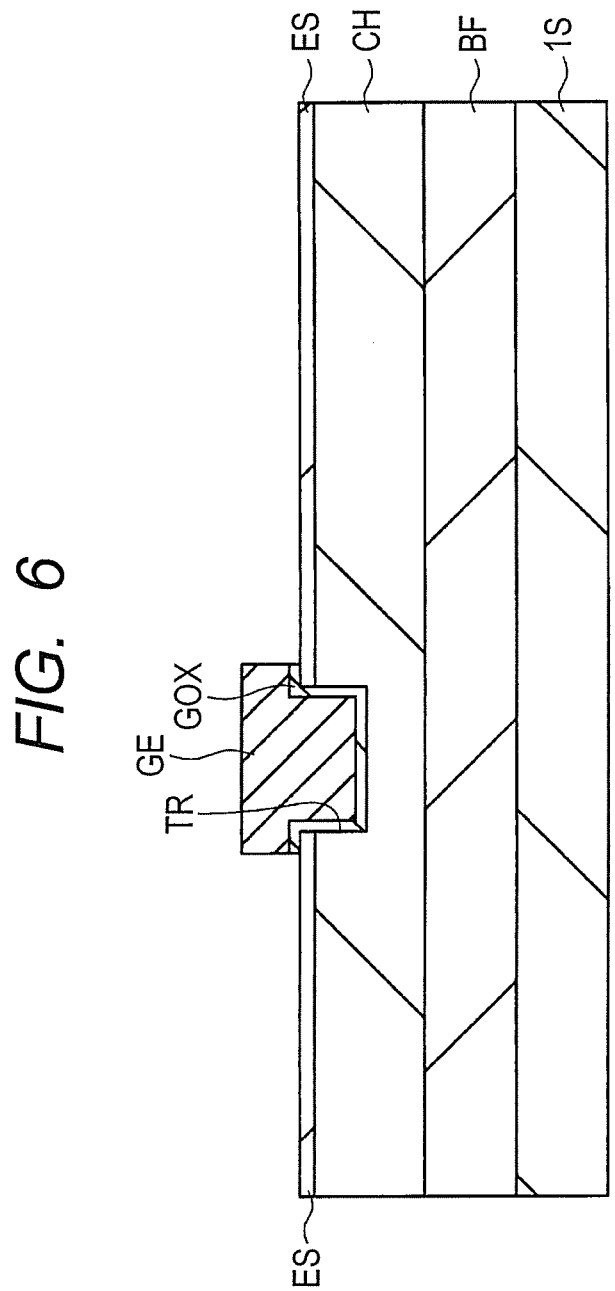
FIG. 6 is a cross-sectional view illustrating the process of manufacturing the power MISFET subsequent to FIG. 5.

Then, as illustrated in FIG. 6, the gate insulating film GOX is formed to extend over from an inner wall of the trench TR onto a part of the electron supply layer ES. The gate insulating film GOX can be formed of, for example, a silicon oxide ($SiO_2$) film, but is not limited to this configuration, and may be formed of a high dielectric constant film higher in dielectric constant than the silicon oxide ($SiO_2$) film.

For example, the high dielectric constant film is formed of an aluminum oxide ($Al_2O_3$) film, or a hafnium oxide ($HfO_2$) film which is one of hafnium oxide. Further, the hafnium oxide ($HfO_2$) film can be replaced with another hafnium-based insulating film such as a hafnium aluminate (HfAlO) film, a hafnium oxynitride (HfON) film, a hafnium silicate (HfSiO) film, or a hafnium silicon oxynitride (HfSiON) film. Further, oxide such as tantalum oxide ($Ta_2O_5$), niobium oxide ($Nb_2O_5$), titanium oxide ($TiO_2$), zirconium oxide (ZrO), lanthanum oxide ($La_2O_3$), or acid yttrium oxide ($Y_2O_3$) can be introduced into those hafnium-based insulating films. Since the hafnium-based insulating film is higher in dielectric constant than the silicon oxide ($SiO_2$) film and the silicon oxynitride (SiON) film like the hafnium oxide ($HfO_2$) film, a leakage current can be reduced as in a case using the hafnium oxide ($HfO_2$) film.

Then, the gate electrode GE made of, for example, titanium nitride (TiN) is formed over the gate insulating film GOX so as to fill an interior of the trench TR. The thickness of the gate electrode GE is, for example, 0.2 μm.

Figure 7:
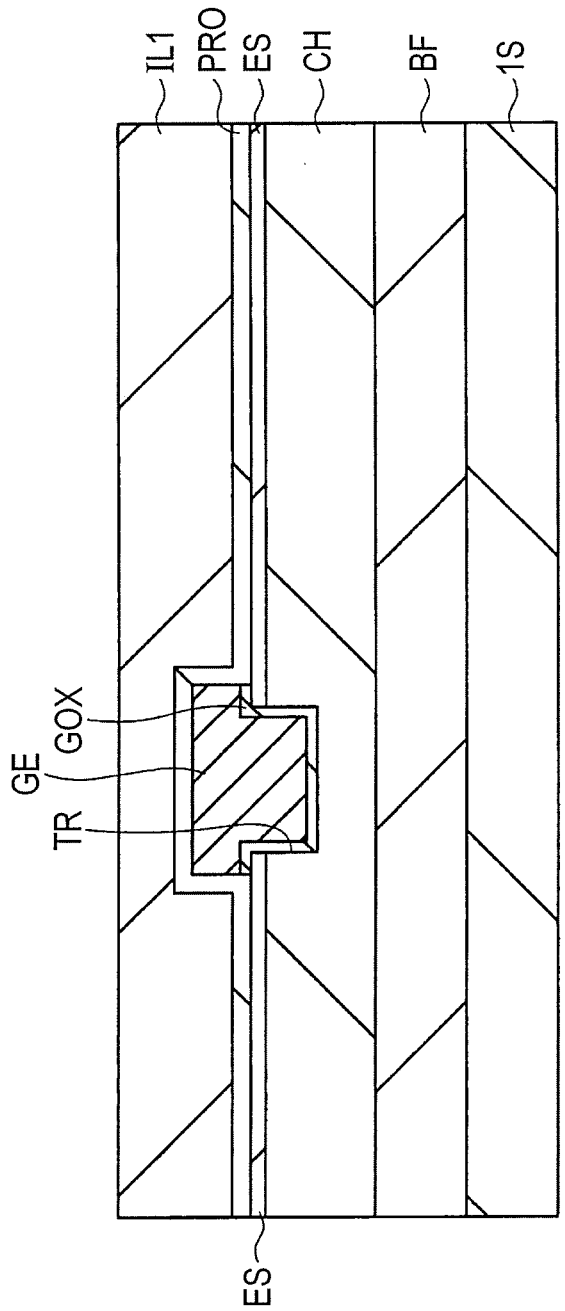
FIG. 7 is a cross-sectional view illustrating the process of manufacturing the power MISFET subsequent to FIG. 6.

Then, as illustrated in FIG. 7, the protective film PRO and the first interlayer insulating film IL1 are formed over the electron supply layer ES in the stated order so as to cover the gate electrode GE. The protective film PRO is made of, for example, silicon nitride (SiN), and has a thickness of, for example, 0.09 μm. Also, the first interlayer insulating film IL1 is formed of a laminated film in which, for example, a silicon oxide ($SiO_2$) film, a TEOS (Tetra Ethyl Ortho Silicate; $Si(OC_2H_5)_4$) film, and a silicon oxide ($SiO_2$) film are laminated on each other in the stated order from a lower layer. The thickness of the silicon oxide ($SiO_2$) film which is the lower layer is, for example, 0.12 μm, the thickness of the TEOS film is, for example, 0.4 μm, and the thickness of the silicon oxide ($SiO_2$) film which is an upper layer is, for example, 0.5 μm. Those films are formed through, for example, a plasma CVD (chemical vapor deposition) technique.

Figure 8:
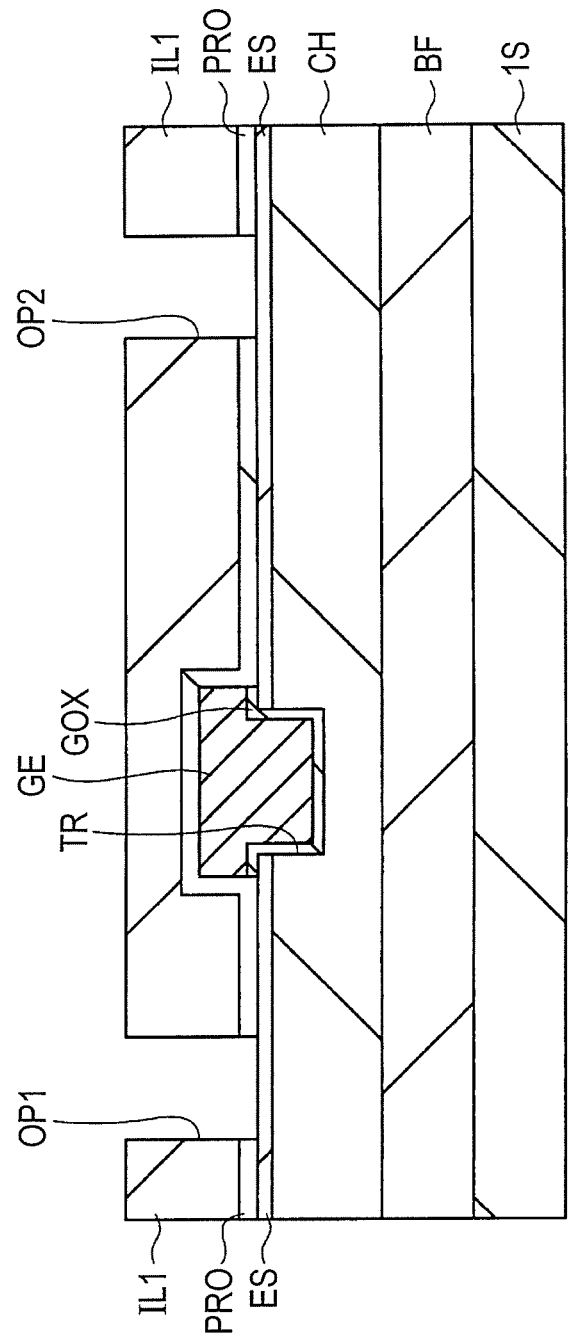
FIG. 8 is a cross-sectional view illustrating the process of manufacturing the power MISFET subsequent to FIG. 7.

Then, as illustrated in FIG. 8, the source contact hole OP1 and the drain contact hole OP2 that penetrate through the first interlayer insulating film IL1 and the protective film PRO are formed through the photolithography and the etching technique.

The source contact hole OP1 is formed to be spaced apart from the gate electrode GE so as to expose a part of the surface of the electron supply layer ES on one side of the gate electrode GE. The drain contact hole OP2 is formed to be spaced apart from the gate electrode GE so as to expose a part of the surface of the electron supply layer ES on the other side of the gate electrode GE. Further, the source contact hole OP1 and the drain contact hole OP2 are formed to extend in the Y-axis direction orthogonal to the X-axis direction along which the active region is extended, and formed to protrude from the active region in the Y-axis direction in the plan view (refer to FIG. 2 described above).

Figure 9:
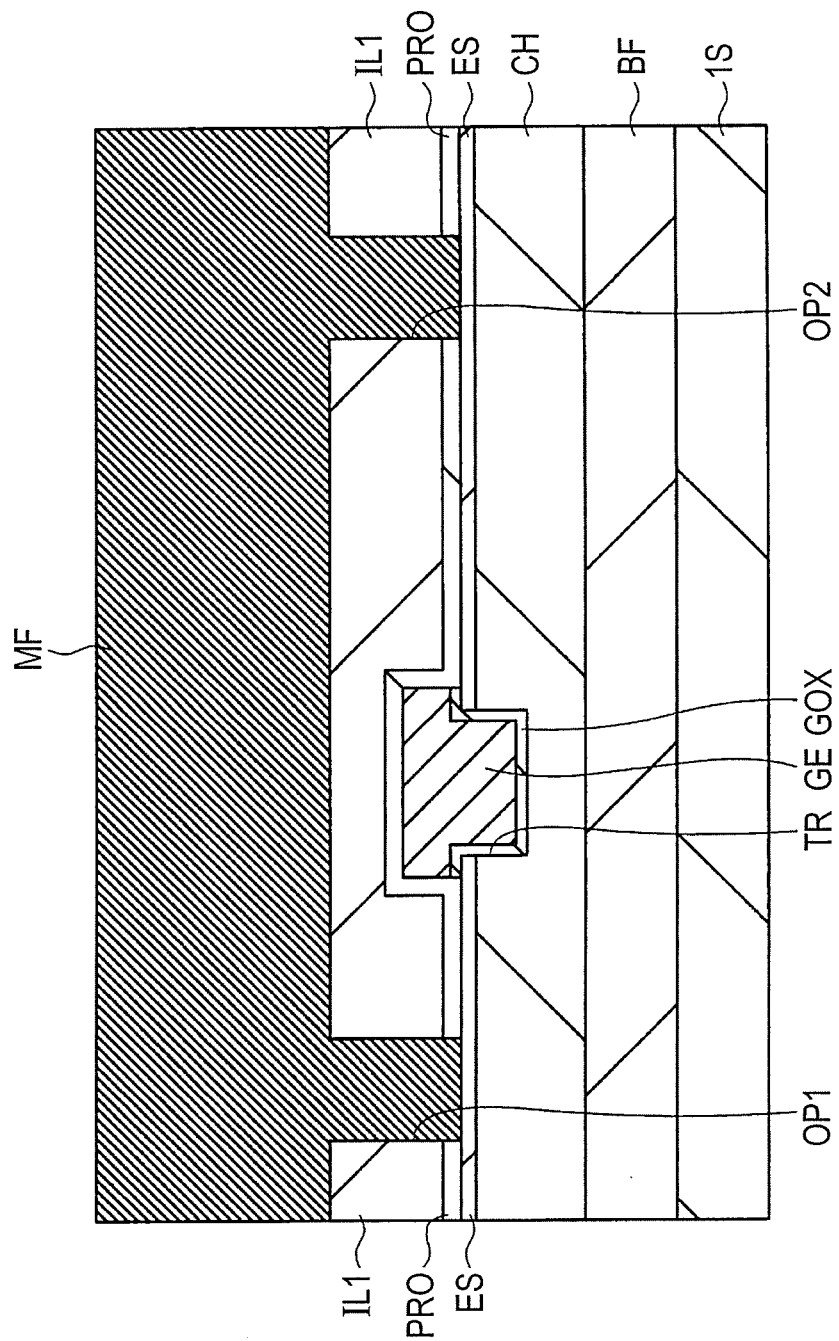
FIG. 9 is a cross-sectional view illustrating the process of manufacturing the power MISFET subsequent to FIG. 8.

Then, as illustrated in FIG. 9, a laminated film MF in which, for example, a titanium (Ti) film, a titanium nitride (TiN), an aluminum (Al) alloy film, and a titanium nitride (TiN) film are laminated on each other in the stated order from a lower layer is formed over the first interlayer insulating film IL1 in which the source contact hole OP1 and the drain contact hole OP2 are formed. The thickness of the titanium (Ti) film is, for example, 0.03 μm. The thickness of the titanium nitride (TiN) below the aluminum (Al) alloy film is, for example, 0.1 μm. The thickness of the aluminum (Al) alloy film is, for example, 4.5 μm. The thickness of the titanium nitride (TiN) above the aluminum (Al) alloy film is, for example, 0.05 μm. Those films are formed through, for example, a sputtering technique. The aluminum (Al) alloy film can be formed of, for example, an aluminum-cupper (Al—Cu) film, or an aluminum-silicon-cupper (Al—Si—Cu) film.

Figure 10:
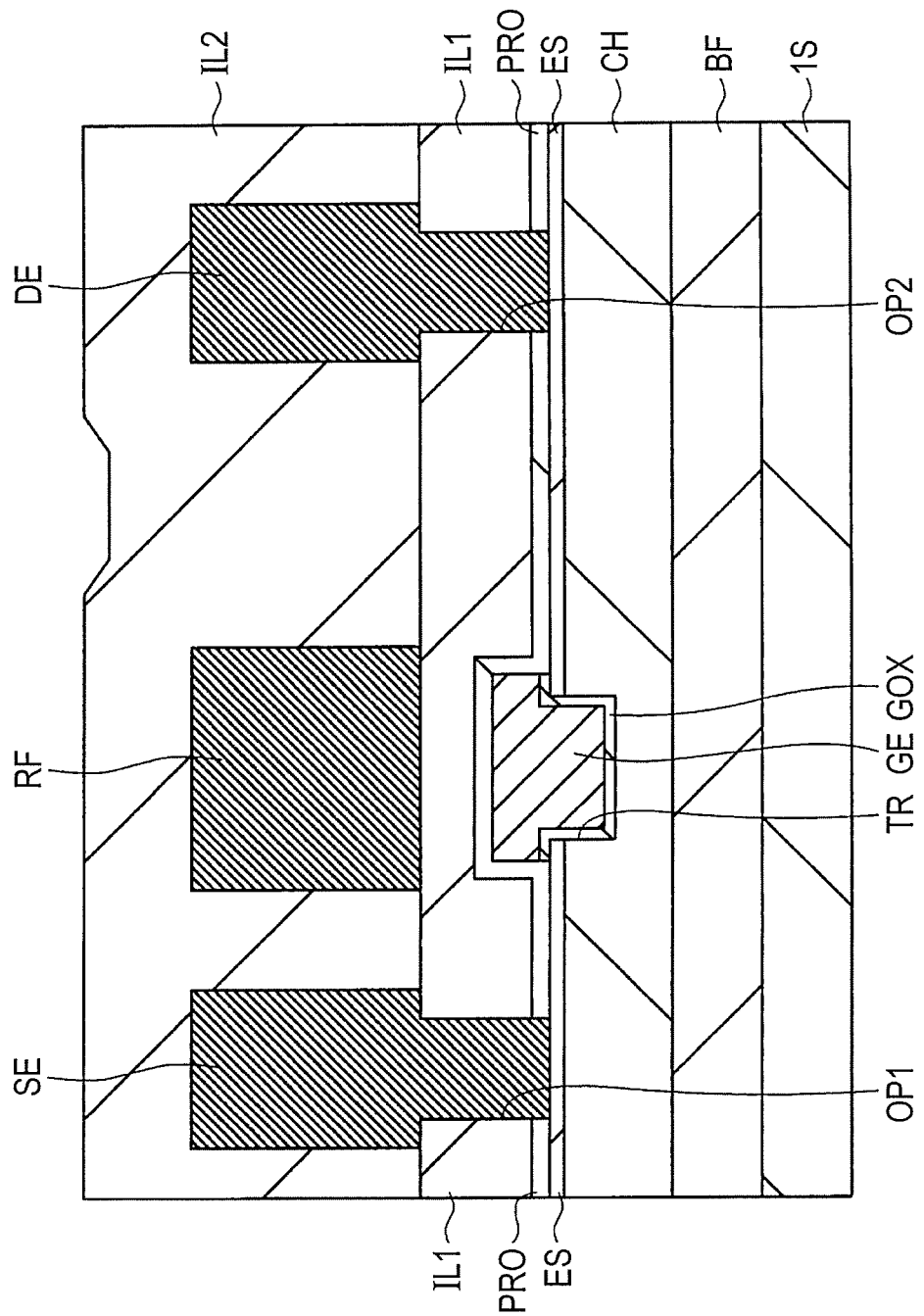
FIG. 10 is a cross-sectional view illustrating the process of manufacturing the power MISFET subsequent to FIG. 9.

Then, as illustrated in FIG. 10, the laminated film MF is patterned through the photolithography and the etching technique.

With the above configuration, the source electrode SE that is embedded within the source contact hole OP1, and extended on a part of the first interlayer insulating film IL1 is formed. That is, the source electrode SE is electrically connected to the electron supply layer ES on one side wall of the gate electrode GE, and formed to be spaced apart from the gate electrode GE. Likewise, the drain electrode DE that is embedded within the drain contact hole OP2, and extended on a part of the first interlayer insulating film IL1 is formed. That is, the drain electrode DE is electrically connected to the electron supply layer ES on the other side wall of the gate electrode GE, and formed to be spaced apart from the gate electrode GE.

Further, the strain relaxation layer RF which is in a floating state spaced apart and isolated from the source electrode SE and the drain electrode DE is formed over the first interlayer insulating film IL1 above the gate electrode GE.

Then, the second interlayer insulating film IL2 is formed over the first interlayer insulating film IL1 so as to cover the source electrode SE, the drain electrode DE, and the strain relaxation layer RF. The second interlayer insulating film IL2 is formed of a laminated film in which, for example, a silicon oxide ($SiO_2$) film and a silicon oxynitride (SiON) film are laminated on each other in the stated order from the lower layer. The thickness of the silicon oxide ($SiO_2$) is, for example, 0.12 μm, and the thickness of the silicon oxynitride (SiON) film is, for example, 0.9 μm.

Figure 11:
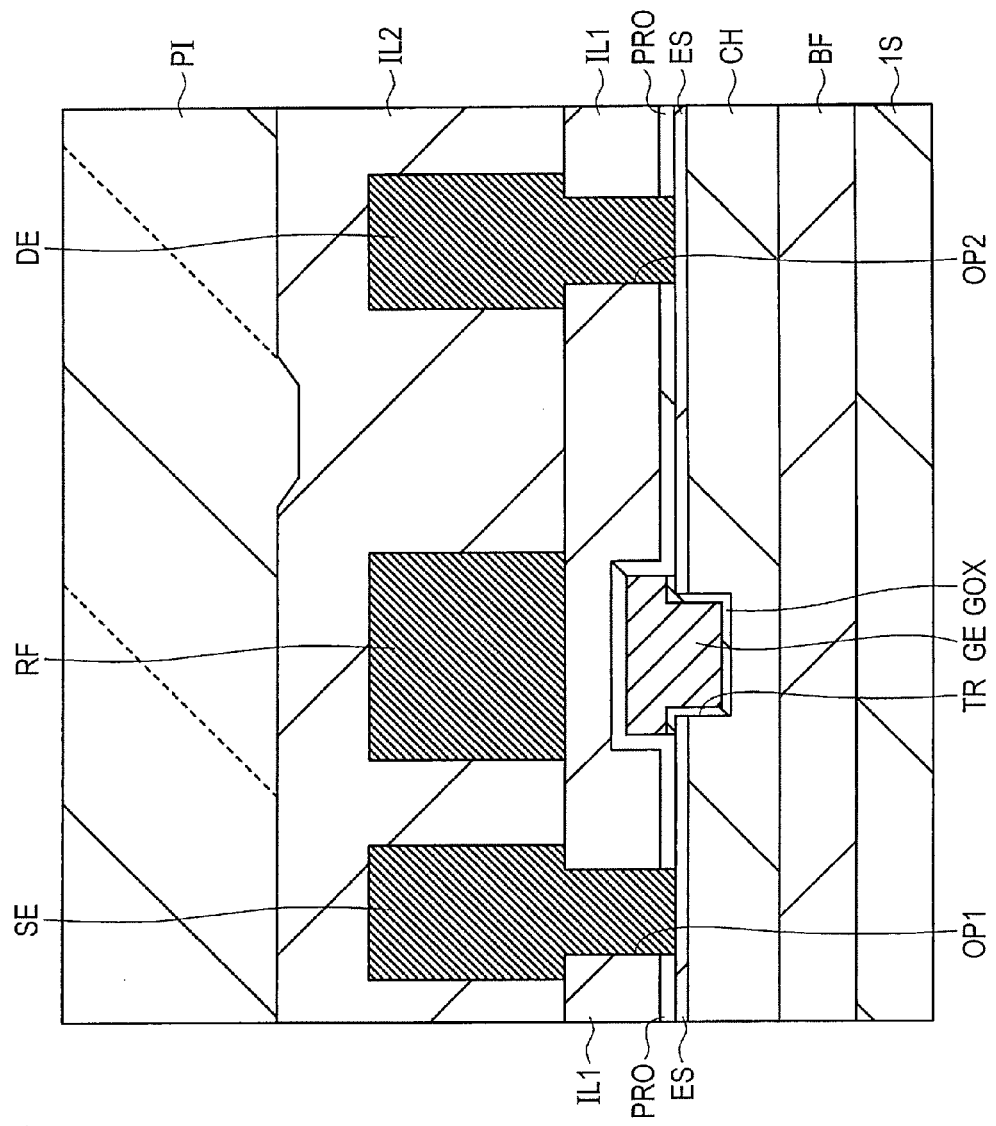
FIG. 11 is a cross-sectional view illustrating the process of manufacturing the power MISFET subsequent to FIG. 10.

Then, as illustrated in FIG. 11, the resin film, for example, the polyimide film PI is formed over the second interlayer insulating film IL2. The thickness of the second interlayer insulating film IL2 is, for example, 5 μm to 7 μm. With the above configuration, the power MISFET according to this embodiment can be formed.

As described above, according to the first embodiment, the strain relaxation film RF is disposed between the polyimide film PI and the gate electrode GE, to suppress the stress strain generated in the electron supply layer ES and the channel layer CH, and suppress a change in the channel electron concentration in the channel layer CH. As a result, the threshold voltage or the on-resistance of the power MISFET can be prevented from fluctuating.

Second Embodiment

Configuration of Power Misfet According to Second Embodiment

A power MISFET according to a second embodiment is different in the shape of the strain relaxation layer RF from the power MISFET according to the first embodiment described above. That is, in the first embodiment described above, the strain relaxation layer RF is formed in the floating state isolated above the gate electrode GE. However, in the second embodiment, a strain relaxation layer RF is formed above a gate electrode GE, and also connected to a source electrode SE. That is, the strain relaxation layer RF is formed integrally with the source electrode SE.

A difference between the second embodiment and the first embodiment resides in a structure of the strain relaxation layer RF, and the other structures are identical or substantially identical with those of the power MISFET in the first embodiment described above, and their description will be omitted.

Figure 12:
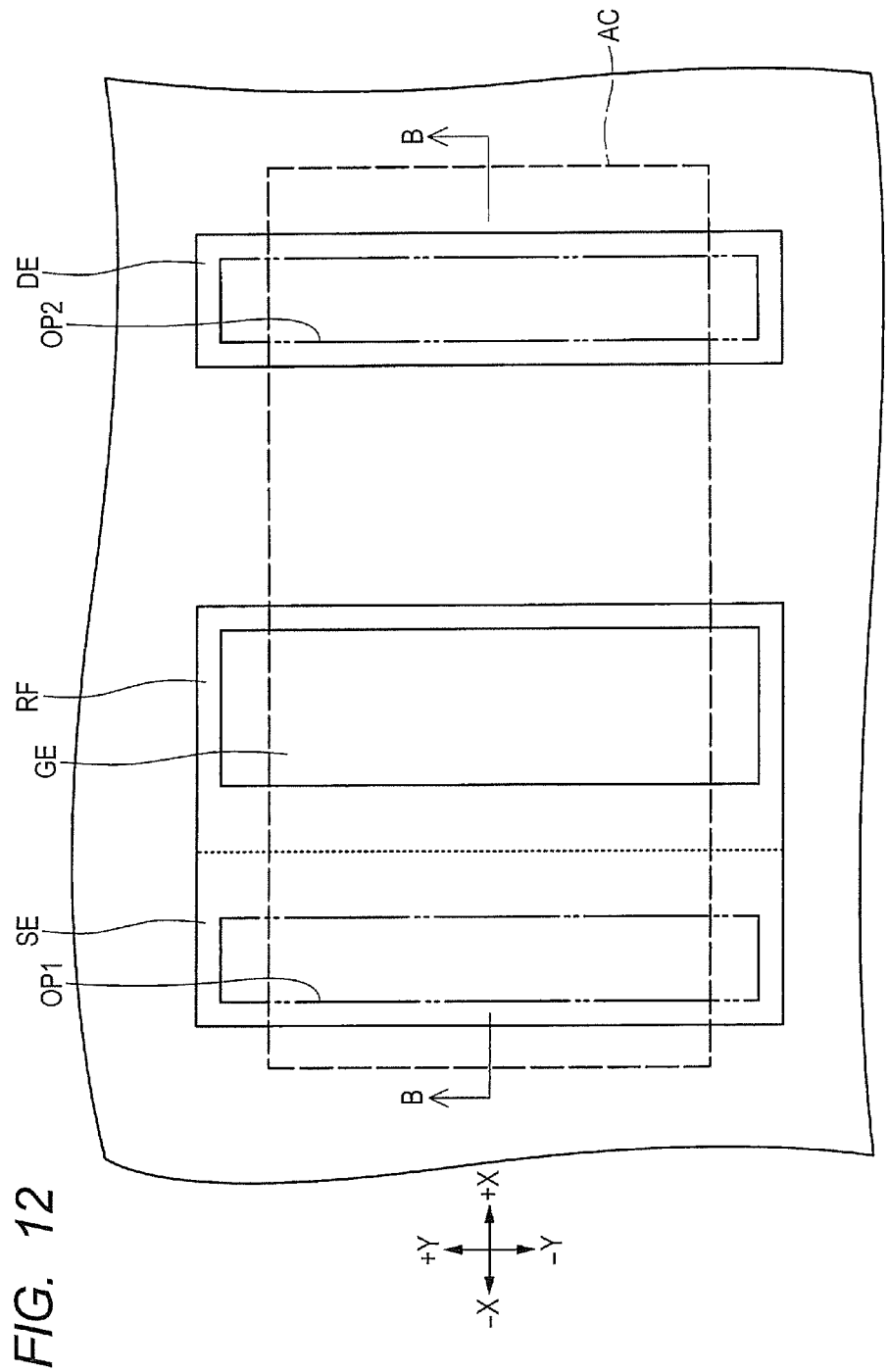
FIG. 12 is a partially enlarged plan view illustrating a configuration example of a power MISFET according to a second embodiment.
Figure 13:
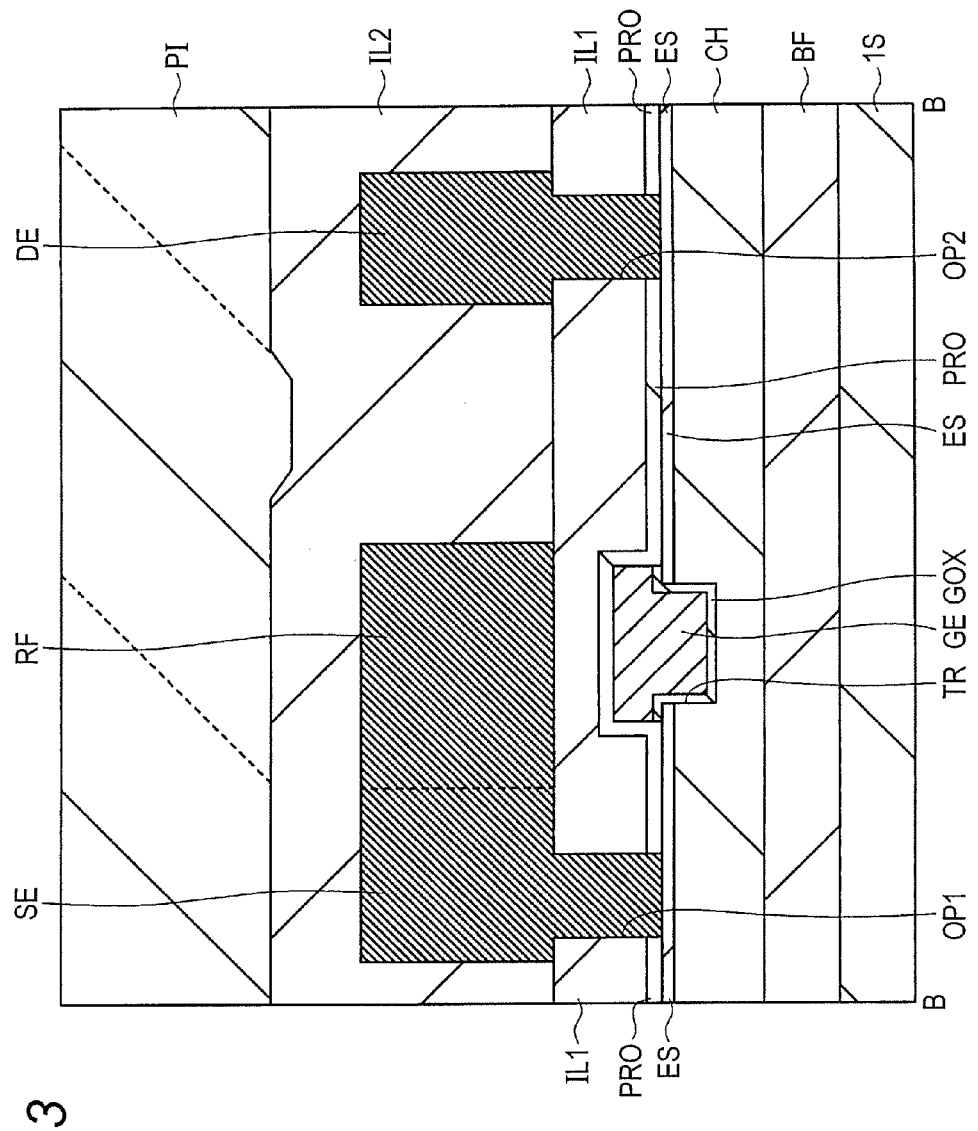
FIG. 13 is a cross-sectional view taken along a line B-B of FIG. 12.

A configuration example of the power MISFET according to the second embodiment will be described with reference to FIGS. 12 and 13. FIG. 12 is a partially enlarged plan view illustrating a configuration example of the power MISFET according to the second embodiment. FIG. 13 is a cross-sectional view taken along a line B-B of FIG. 12.

As illustrated in FIGS. 12 and 13, the strain relaxation layer RF is formed above the gate electrode GE. The strain relaxation layer RF is formed of a laminated film (hereinafter also referred to as "Ti/TiN/Al—Cu/TiN laminated film") in which, for example, a titanium (Ti) film, a titanium nitride (TiN) film, an aluminum-copper (Al—Cu) alloy film, and a titanium nitride (TiN) film are laminated on each other in the stated order from a lower layer. The strain relaxation layer RF is formed over the first interlayer insulating film ILL The thickness of the titanium (Ti) film in the Ti/TiN/Al—Cu/TiN laminated film is, for example, 0.03 μm. The thickness of the titanium nitride (TiN) film below the aluminum-copper (Al—Cu) alloy film is, for example, 0.1 μm. The thickness of the aluminum-copper (Al—Cu) alloy film is, for example, 4.5 μm. The thickness of the titanium nitride (TiN) film over the aluminum-copper (Al—Cu) alloy film is, for example, 0.05 μm.

The strain relaxation layer RF and the source electrode SE are connected to each other, and formed integrally with each other. Therefore, since the strain relaxation layer RF is connected to the electron supply layer ES through the source electrode SE, a temperature of the strain relaxation layer RF can be made identical with a temperature of the source electrode SE and the channel layer CH.

As described in the above first embodiment, the strain relaxation layer RF is disposed between the polyimide film PI and the gate electrode GE, as a result of which the stress from the polyimide film PI is exerted on the strain relaxation layer RF. With this configuration, the stress exerted on the electron supply layer ES below the gate electrode GE, and the channel layer CH from the polyimide film PI can be suppressed. Further, in the second embodiment, in addition to the above advantage, since a temperature difference between the strain relaxation layer RF, and the electron supply layer ES as well as the channel layer CH is eliminated, the stress strain generated in the electron supply layer ES and the channel layer CH can further be suppressed.

As described above, according to the second embodiment, the strain relaxation layer RF that electrically connects the electron supply layer ES to the channel layer CH is disposed between the polyimide film PI and the gate electrode GE, as a result of which the stress strain generated in the electron supply layer ES and the channel layer CH can be suppressed to suppress a change of the channel electron concentration in the channel layer CH. With the above configuration, the threshold voltage or the on-resistance of the power MISFET can be prevented from fluctuating.

Third Embodiment

Configuration of Power MISFET According to Third Embodiment

In a power MISFET according to a third embodiment, a film that can suppress a stress strain generated in an electron supply layer ES and a channel layer CH is disposed between adjacent active regions AC in a plan view.

Figure 14:
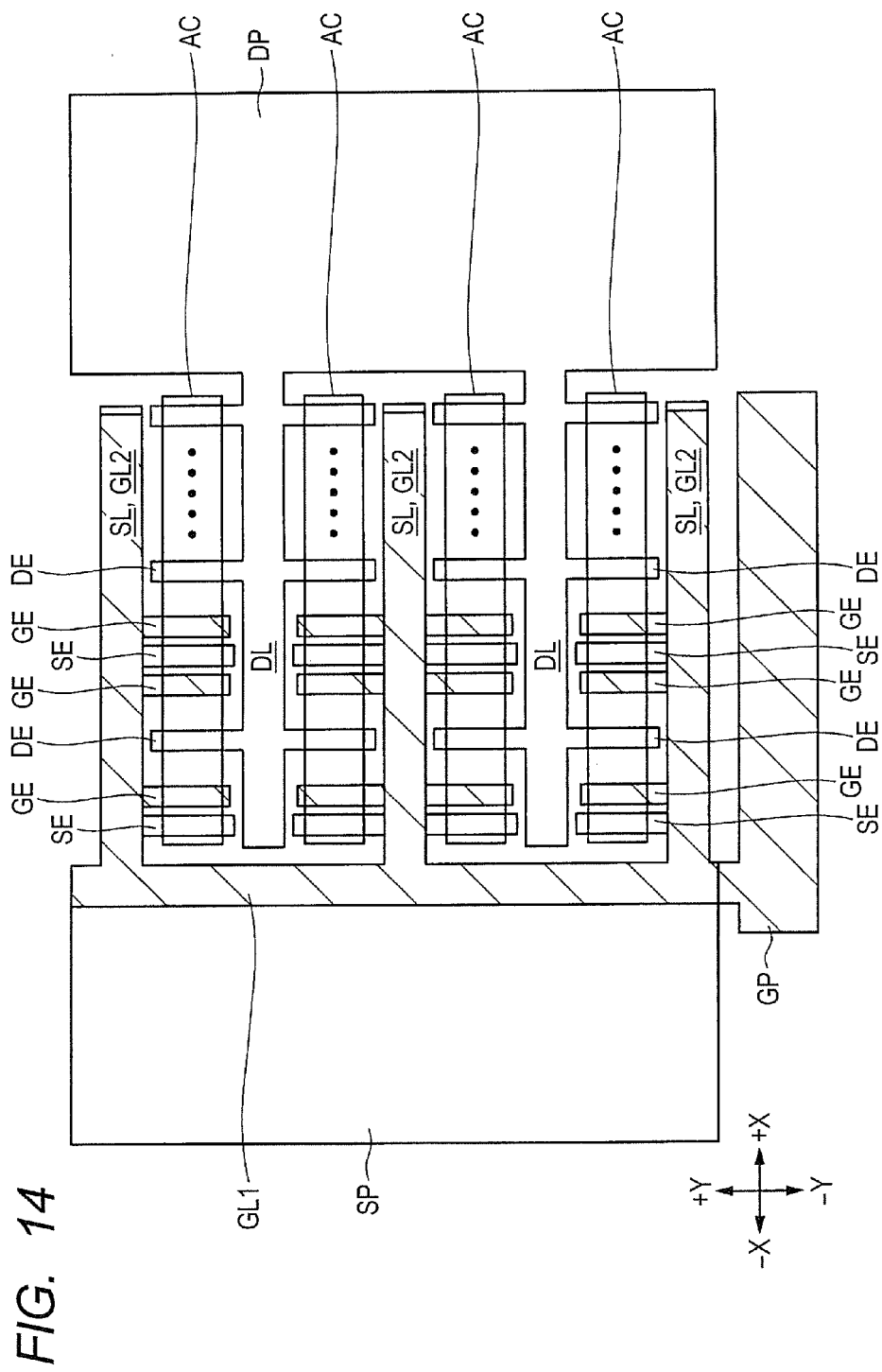
FIG. 14 is a plan view illustrating a configuration example of a power MISFET according to a third embodiment.

A configuration example of the power MISFET according to the third embodiment will be described with reference to FIG. 14. FIG. 14 is a plan view illustrating a configuration example of the power MISFET according to the third embodiment.

As illustrated in FIG. 14, in the power MISFET, a source pad SP is arranged on a left end of a paper plane, and a drain pad DP is arranged on a right end of the paper plane. A plurality of active regions AC extending in the X-axis direction (a direction along which the source pad SP and the drain pad DP face each other), and having given intervals in the Y-axis direction orthogonal to the X-axis direction is disposed between the source pad SP and the drain pad DP arranged on the right and left sides.

The source pad is formed to extend in the Y-axis direction, and a plurality of comb-shaped source bus electrodes (also called "source bus bars" or "source lines") SL extending from the source pad SP in a direction (+X-axis direction) toward the drain pad DP is so formed as to protrude from the source pad SP. The source pad SP and the plurality of source bus electrodes SL are formed integrally with each other, and formed of a laminated film (hereinafter also called "Ti/TiN/Al—Cu/TiN laminated film") in which, for example, a titanium (Ti) film, a titanium nitride (TiN) film, an aluminum-copper (Al—Cu) alloy film, and a titanium nitride (TiN) film are laminated on each other in the stated order from the lower layer. The plurality of source bus electrodes SL extending in the X-axis direction functions as support rods that can relax the stress strains of the electron supply layer and the channel layer generated in the X-axis direction.

Likewise, the drain pad DP is formed to extend in the Y-axis direction, and a plurality of comb-shaped drain bus electrodes (also called "drain bus bars" or "drain lines") DL extending from the drain pad DP in a direction (−X-axis direction) toward the source pad SP is so formed as to protrude from the drain pad DP. The drain pad DP and the plurality of drain bus electrodes DL are formed integrally with each other, and formed of, for example, the above Ti/TiN/Al—Cu/TiN laminated film. The plurality of drain bus electrodes DL extending in the X-axis direction functions as support rods that can relax the stress strains of the electron supply layer and the channel layer generated in the X-axis direction.

The respective source bus electrodes SL and the respective drain bus electrodes DL are alternately arranged along the Y-axis direction. The active regions AC extending in the X-axis direction are arranged between the respective source bus electrodes SL and the respective drain bus electrodes DL which are alternately arranged.

Further, in the power MISFET, a gate pad GP is arranged to be spaced apart from the source pad SP and the drain pad DP. A first gate bus electrode (also called "first gate bus bar" or "first gate line") GL1 extending in the Y-axis direction is so formed as to protrude from the gate pad GP. The gate pad GP and the first gate bus electrode GL1 are formed integrally with each other, and made of, for example, titanium nitride (TiN).

The first gate bus electrode GL1 is arranged below the source pad SP extending in the Y-axis direction through an insulating film (not shown). The insulating film is formed of, for example, the protective film PRO and the first interlayer insulating film IL1 described in the above first embodiment.

Also, a plurality of comb-shaped second gate bus electrodes (also called "second gate bus bars" or "second gate lines") GL2 extending from the source pad SP in the direction (+X-axis direction) toward the drain pad DP is so formed as to protrude from the first gate bus electrode GL1. The second gate bus electrodes GL2 are formed integrally with the gate pad GP and the first gate bus electrode GL1.

The plurality of second gate bus electrodes GL2 is arranged below the plurality of source bus electrodes SL extending in the X-axis direction through an insulating film (not shown). The respective second gate bus electrodes GL2 and the respective source bus electrodes SL are arranged to vertically overlap with each other through the insulating film. The insulating film is formed of, for example, the protective film PRO and the first interlayer insulating film IL1 described in the above first embodiment.

Further, a plurality of comb-shaped source electrodes SE is so formed as to protrude from the respective source bus electrodes SL extending in the X-axis direction toward the Y-axis direction. The plurality of source electrodes SE is formed integrally with the source pad SP and the plurality of source bus electrodes SL. Likewise, a plurality of comb-shaped drain electrodes DE is so formed as to protrude from the respective drain bus electrodes DL extending in the X-axis direction toward the Y-axis direction. The plurality of drain electrodes DE is formed integrally with the drain pad DP and the plurality of drain bus electrodes DL.

Also, a plurality of comb-shaped gate electrodes GE is so formed as to protrude from the respective second gate bus electrodes GL2 extending in the X-axis direction toward the Y-axis direction. The plurality of gate electrodes GE is formed integrally with the gate pad GP, the first gate bus electrode GL1, and the second gate bus electrodes GL2.

The respective source electrodes SE and the respective drain electrodes DE are alternately arranged along the X-axis direction. In this situation, the gate electrodes GE are arranged between the respective source electrodes SE and the respective drain electrodes DE which are alternately arranged.

Features of Power MISFET According to Third Embodiment

Now, the features of the power MISFET according to the third embodiment will be described below.

The plurality of source bus electrodes SL and the plurality of drain bus electrodes DL, which are formed to extend in the X-axis direction between the source pad SP and the drain pad DP are each formed of a Ti/TiN/Al—Cu/TiN laminated film, and function as support rods that can relax the stress strain of the electron supply layer and the channel layer which is generated in the X-axis direction. In particular, the plurality of second gate bus electrodes GL2 is formed below the plurality of source bus electrodes SL through an insulating film. The respective source bus electrodes SL and the respective second gate bus electrodes GL2 are formed to vertically overlap with each other through the insulating film. In this way, the respective source bus electrodes SL and the respective second gate bus electrodes GL2 are formed to vertically overlap with each other through the insulating film, to thereby make it difficult to deflect the electron supply layer and the channel layer. As a result, the stress strain generated in the electron supply layer and the channel layer can further be suppressed in the X-axis direction.

As described above, according to the third embodiment, the plurality of source bus electrodes SL and the plurality of drain bus electrodes DL, which extend in the direction (X-axis direction) along which the source pad SP and the drain pad DP face each other, are disposed between the source pad SP and the drain pad DP. With this configuration, the source bus electrodes SL and the drain bus electrodes DL function as support rods, and the deflection of the electron supply layer and the channel layer, which is generated in the X-axis direction, can be suppressed to reduce the stress strain. Further, the respective second gate bus electrodes GL2 is so disposed as to vertically overlap with the respective source bus electrodes SL through the insulating film with the result that the deflection of the electron supply layer and the channel layer, which is generated in the X-axis direction, can further be suppressed. With the above configuration, since a change of the channel electron concentration in the channel layer can be suppressed, the threshold voltage or the on-resistance of the power MISFET can be prevented from fluctuating.

Modification of Power MISFET According to Third Embodiment

Even in the power MISFET according to the above third embodiment, as in the above first and second embodiments, a plurality of strain relaxation layers RF can be formed above the plurality of gate electrodes GE.

Figure 15:
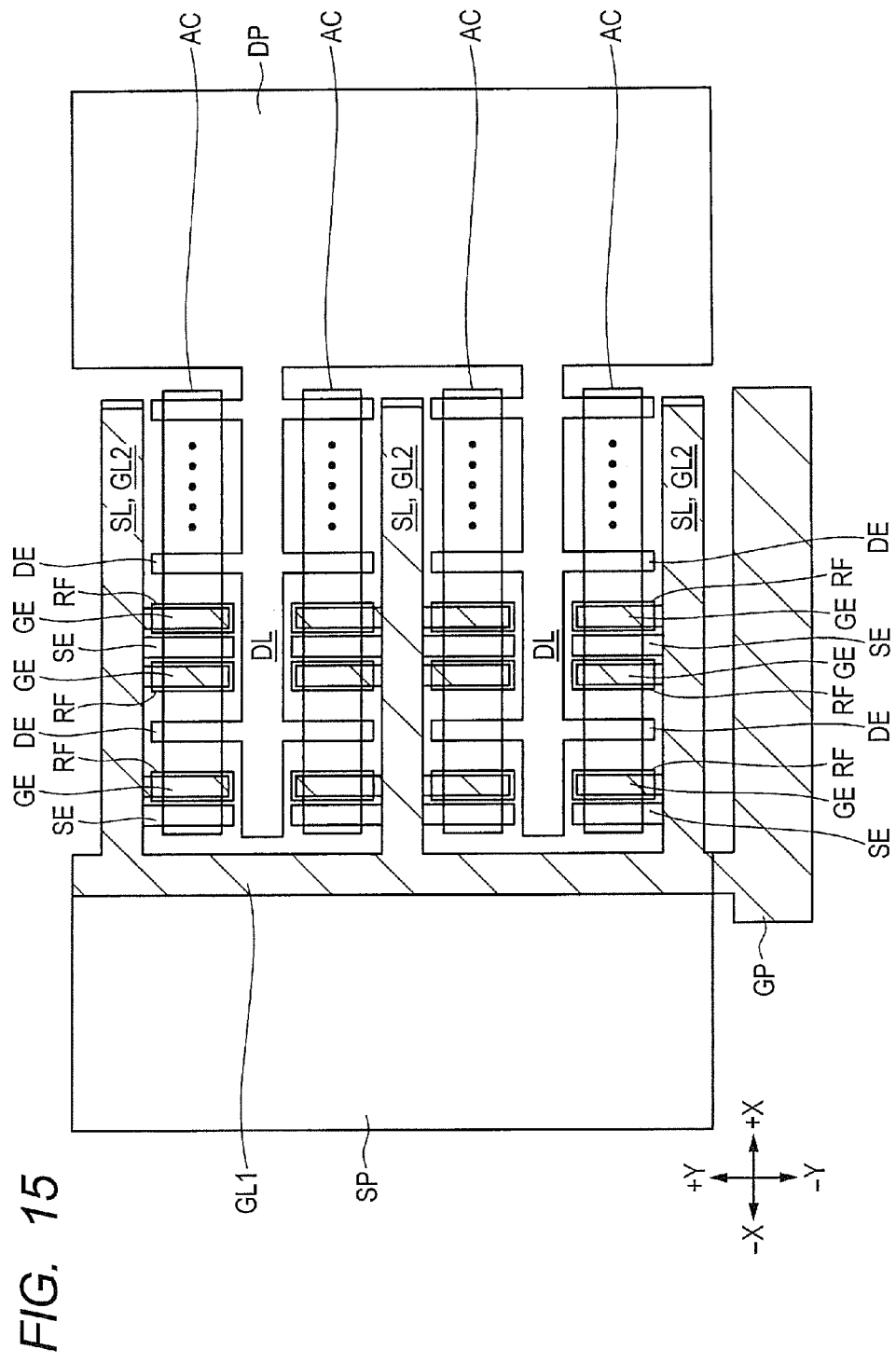
FIG. 15 is a plan view illustrating a configuration example of a power MISFET according to a modification of the third embodiment.

FIG. 15 is a plan view illustrating a configuration example of a power MISFET according to a modification of the third embodiment.

As illustrated in FIG. 15, the plurality of strain relaxation layer RF is formed above the plurality of gate electrodes GE extending in the Y-axis direction through an insulating film (not shown). The respective gate electrodes GE and the respective strain relaxation layers RF are formed to vertically overlap with each other through the insulating film. The plurality of strain relaxation layers RF is formed in the same layer as that of the source pad SP, the plurality of source bus electrodes SL, and the plurality of source electrodes SE as well as the drain pad DP, the plurality of drain bus electrodes DL, and the plurality of drain electrodes DE. The plurality of strain relaxation layers RF is formed of, for example, a Ti/TiN/Al—Cu/TiN laminated film. Also, the insulating film is formed of, for example, the protective film PRO and the first interlayer insulating film IL1 described in the above first embodiment.

That is, the strain relaxation layer RF described in the modification of the third embodiment is the same as the strain relaxation layer RF described in the above first embodiment, and is disposed between the polyimide film PI and the gate electrode GE (refer to FIG. 3 described above).

Also, like the strain relaxation layer RF described in the above first embodiment, the strain relaxation layer RF described in the modification of the third embodiment is formed in a floating state isolated above the gate electrodes GE. Alternatively, like the strain relaxation layer RF described in the above second embodiment, the strain relaxation layer RF may be connected to the source electrode SE.

That is, the strain relaxation layer RF, and the source electrode SE, the source bus electrodes SL may be formed integrally with each other.

Fourth Embodiment

Configuration of Power MISFET According to Fourth Embodiment

A power MISFET according to a fourth embodiment is different from the power MISFET according to the above third embodiment in that a plurality of dummy patterns is disposed below the plurality of drain bus electrodes DL.

A difference between the fourth embodiment and the third embodiment resides in that the dummy patterns are disposed, and the other structures are identical or substantially identical with the power MISFET according to the third embodiment. Therefore, only the dummy patterns will be described.

Figure 16:
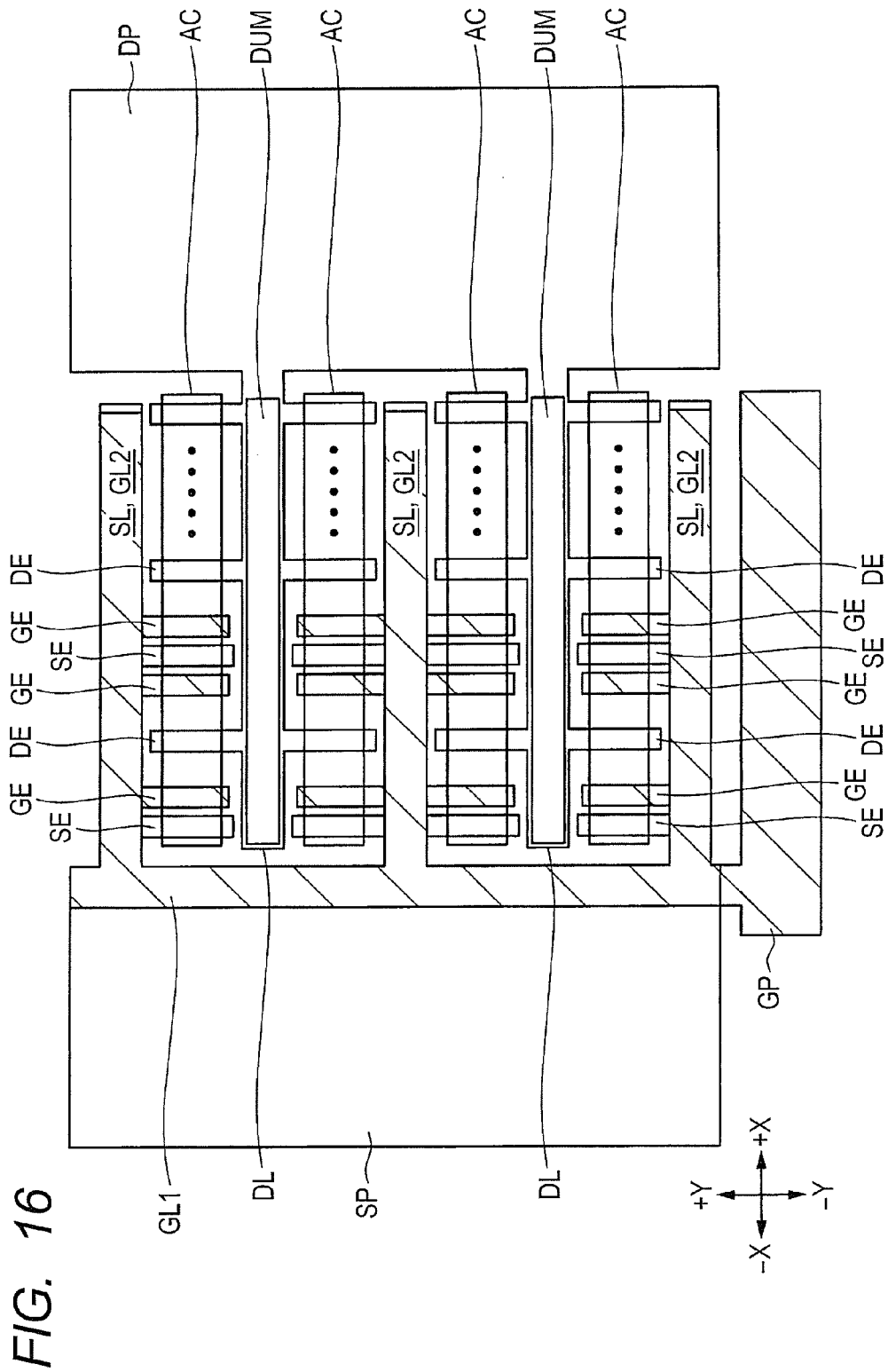
FIG. 16 is a plan view illustrating a configuration example of a power MISFET according to a fourth embodiment.

A configuration example of the power MISFET according to the fourth embodiment will be described with reference to FIG. 16. FIG. 16 is a plan view illustrating a configuration example of the power MISFET according to the fourth embodiment.

As illustrated in FIG. 16, in the power MISFET, like the power MISFET described in the above third embodiment, the drain pad DP is formed to extend in the Y-axis direction, and a plurality of comb-shaped drain bus electrodes DL extending from a drain pad DP in a direction (−X-axis direction) toward a source pad SP is so formed as to protrude from the drain pad DP. Further, a plurality of comb-shaped drain electrodes DE is formed to protrude from the respective drain bus electrodes DL extending in the X-axis direction toward the Y-axis direction.

The drain pad DP, the plurality of drain bus electrodes DL, and the plurality of drain electrodes DE are formed integrally with each other, and formed of a laminated film (hereinafter also called "Ti/TiN/Al—Cu/TiN laminated film") in which, for example, a titanium (Ti) film, a titanium nitride (TiN) film, an aluminum-copper (Al—Cu) alloy film, and a titanium nitride (TiN) film are laminated on each other in the stated order from the lower layer.

Further, a plurality of dummy patterns DUM is formed below the plurality of drain bus electrodes DL through an insulating film (not shown), and the respective drain bus electrodes DL and the respective dummy patterns DUM are formed to vertically overlap with each other through the insulating film. The insulating film is formed of the protective film PRO and the first interlayer insulating film IL1 described in the above first embodiment.

The plurality of dummy patterns DUM are formed in the same layer as that of the gate pad GP, the first gate bus electrode GL1, and the plurality of second gate bus electrodes GL2, and formed a floating state isolated below the plurality of drain bus electrodes DL. In this way, the respective drain bus electrodes DL and the respective dummy patterns DUM are formed to vertically overlap with each other through the insulating film, to thereby make difficult to deflect the electron supply layer and the channel layer. As a result, the stress strain generated in the electron supply layer and the channel layer can further be suppressed.

As described above, according to the fourth embodiment, the respective dummy patterns DUM are disposed between the source pad SP and the drain pad DP so as to vertically overlap with the respective drain bus electrodes DL through the insulating film. With the above configuration, the deflection of the electron supply layer and the channel layer, which is generated in the direction (X-axis direction) along which the source pad SP and the drain pad DP face each other can further be suppressed. As a result, since a change of the channel electron concentration in the channel layer can be suppressed, the threshold voltage or the on-resistance of the power MISFET can be prevented from fluctuating.

The invention made by the present inventors has been described above specifically on the basis of the embodiments. However, the present invention is not limited to the above embodiments, and can be variously changed without departing from the spirit of the invention.

The invention claimed is:

1. A semiconductor device, comprising:
a substrate;
a buffer layer provided on the substrate;
a channel layer provided on the buffer layer;
an electron supply layer provided on the channel layer;
a first contact hole provided on the electron supply layer;
a source electrode that is formed within the first contact hole, and electrically connected to the electron supply layer;
a second contact hole provided on the electron supply layer;
a drain electrode that is formed within the second contact hole, and electrically connected to the electron supply layer;
a gate electrode provided between the source electrode and the drain electrode;
a second insulating film that is formed to cover the gate electrode;
a strain relaxation film that is formed over the second insulating film above the gate electrode;
a third insulating film that is formed to cover the source electrode, the drain electrode, and the strain relaxation film; and
an organic film that is formed over the third insulating film,
wherein the gate electrode that is formed over the channel layer of an active region through a first insulating film, and extends in a first direction
wherein the first contact hole that is spaced apart from the gate electrode on one side of the gate electrode, formed over the second insulating film, and extends in the first direction,
wherein the second contact hole that is spaced apart from the gate electrode on the other side of the gate electrode, formed over the second insulating film, and extends in the first direction,
wherein the gate electrode includes a first outermost sidewall and a second outermost sidewall which is opposite the first outermost sidewall, and the strain relaxation film is formed between the organic film and the first and second outermost sidewalls.

2. The semiconductor device according to claim 1, wherein the strain relaxation film has the same layer as that of the source electrode.

3. The semiconductor device according to claim 1, wherein the strain relaxation film has the same layer as that of the source electrode, and the strain relaxation film is formed integrally with the source electrode.

4. The semiconductor device according to claim 1, wherein the strain relaxation film includes an aluminum alloy film.

5. The semiconductor device according to claim 4, wherein the aluminum alloy film comprises one of an aluminum-copper alloy film and an aluminum-silicon-copper alloy film.

6. The semiconductor device according to claim 1, wherein the strain relaxation film comprises a laminated film in which a titanium film, a titanium nitride film, an aluminum alloy film, and a titanium nitride film are laminated on each other in the stated order from a lower layer, or a laminated film in which a titanium film, an aluminum alloy film, and a titanium nitride film are laminated on each other in the stated order from the lower layer.

7. The semiconductor device according to claim 1, wherein the strain relaxation film comprises a material that generates a tensile stress in response to a heat, and the organic film comprises a material that generates a compressive stress in response to the heat.

8. The semiconductor device according to claim 1, wherein the organic film comprises at least one of a polyimide film or a resin film.

9. The semiconductor device according to claim 1, wherein the first contact hole and the second contact hole are protruded from the active region in the first direction.

10. A semiconductor device, comprising:
a substrate;
a buffer layer provided on the substrate;
a channel layer provided on the buffer layer;
an electron supply layer provided on the channel layer;
a gate pad that is formed over the channel layer through a first insulating film;
a first gate bus electrode that is protruded from the gate pad in a first direction;
a plurality of second gate bus electrodes that is protruded from the first gate bus electrode in a second direction orthogonal to the first direction;
a second insulating film that is formed to cover the gate pad, the first gate bus electrode, and the plurality of second gate bus electrodes;
a source pad that is formed over the second insulating film;
a plurality of source bus electrodes that is protruded from the source pad in the second direction;
a drain pad that is formed over the second insulating film, and spaced apart from the source pad so as to face the source pad in the second direction;
a plurality of drain bus electrodes that is protruded from the drain pad in a direction opposite to the second direction;
a third insulating film that is formed to cover the plurality of source bus electrodes and the plurality of drain bus electrodes; and
an organic film that is formed over the third insulating film,
wherein the respective source bus electrodes and the respective drain bus electrodes are alternately arranged along the first direction in a plan view, and
wherein the respective source bus electrodes and the respective second gate bus electrodes are arranged to vertically overlap with each other through the second insulating film.

11. The semiconductor device according to claim 10, wherein a plurality of active regions that extends in the second direction is disposed to be sandwiched between the respective source bus electrodes and the respective drain bus electrodes in a plan view.

12. The semiconductor device according to claim 10, further comprising:
a plurality of dummy patterns that is formed in the second insulating film below the plurality of drain bus electrodes,
wherein the respective drain bus electrodes and the respective dummy patterns are arranged to vertically overlap with each other through the second insulating film.

13. The semiconductor device according to claim 12, wherein a plurality of dummy patterns has the same layer as the first gate bus electrode and the plurality of second gate bus electrodes.

14. The semiconductor device according to claim 10, further comprising:
a plurality of source electrodes that is protruded from the respective source bus electrodes in the first direction;
a plurality of drain electrodes that is protruded from the respective drain bus electrodes in the first direction; and
a plurality of gate electrodes that is protruded from the respective second gate bus electrodes in the first direction,
wherein the respective source electrodes and the respective drain electrodes are alternately arranged along the second direction in a plan view, and
wherein the plurality of gate electrodes is disposed to be sandwiched between the respective source electrodes and the respective drain electrodes in the plan view.

15. The semiconductor device according to claim 14, further comprising:
a plurality of strain relaxation films on the second insulating film above the plurality of gate electrodes,
wherein the respective gate electrodes and the respective strain relaxation films are arranged to vertically overlap with each other through the second insulating film.

16. The semiconductor device according to claim 15, wherein the plurality of strain relaxation films has the same layer as that of the plurality of source electrodes.

17. The semiconductor device according to claim 15, wherein the plurality of strain relaxation films has the same layer as that of the plurality of source electrodes, and the respective strain relaxation films and the respective source electrodes are formed integrally with the respective source electrodes.

18. The semiconductor device according to claim 10, wherein the plurality of source bus electrodes and the plurality of drain bus electrodes each include an aluminum alloy film.

19. The semiconductor device according to claim 10, wherein the plurality of source bus electrodes and the plurality of drain bus electrodes comprise a laminated film in which a titanium film, a titanium nitride film, an aluminum alloy film, and a titanium nitride film are laminated on each other in the stated order from a lower layer, or a laminated film in which a titanium film, an aluminum alloy film, and a titanium nitride film are laminated on each other in the stated order from the lower layer.

20. The semiconductor device according to claim 10, wherein the organic film comprises at least one of a polyimide film or a resin film.

21. The semiconductor device according to claim 1, wherein a width of the strain relaxation film in a second direction orthogonal to the first direction, is greater than a width of the gate electrode in the second direction, such that the strain relaxation film is formed between the organic film and the first outermost sidewall in the first direction and between the organic film and the second outermost sidewall in the first direction.

22. The semiconductor device according to claim 1, further comprising:
a trench formed in the electron supply layer and the channel layer, the first insulating film being formed in the trench, and the gate electrode comprising a lower portion formed in the trench on the first insulating film.

23. The semiconductor device according to claim 22, wherein the electron supply layer comprises a hole aligned with the trench, and the first insulating film is formed in the hole of the electron supply layer, and
wherein the gate electrode comprises an upper portion having a width which is greater than a width of the first portion and including the first and second outermost sidewalls, and the first and second outermost sidewalls are formed on the electron supply layer.

* * * * *